US006312978B1

United States Patent
Law et al.

(10) Patent No.: US 6,312,978 B1
(45) Date of Patent: Nov. 6, 2001

(54) METHOD FOR LEADLESS DIE INTERCONNECT WITHOUT SUBSTRATE CAVITY

(76) Inventors: Ronald Leavitt Law, 758 Rockinghorse La., Vista, CA (US) 92083; Apurba Roy, 2313 Camino Robledo, Carlsbad, CA (US) 92009

( * ) Notice: Subject to any disclaimer, the term of this patent is extended or adjusted under 35 U.S.C. 154(b) by 0 days.

(21) Appl. No.: 09/560,987

(22) Filed: Apr. 28, 2000

Related U.S. Application Data
(60) Provisional application No. 60/175,078, filed on Jan. 7, 2000.

(51) Int. Cl.[7] .................................................... H01L 21/44
(52) U.S. Cl. ............................ 438/122; 438/121; 438/124
(58) Field of Search .................................... 438/118–125; 257/704, 707, 706, 712, 713, 717

(56) References Cited

U.S. PATENT DOCUMENTS

| | | | |
|---|---|---|---|
| 5,219,794 | * | 6/1993 | Satoh et al. ............................ 438/126 |
| 5,901,050 | * | 5/1999 | Imai ....................................... 257/704 |
| 5,905,636 | * | 5/1999 | Baska et al. ........................... 257/712 |
| 5,909,056 | * | 6/1999 | Mertol ................................... 257/704 |
| 5,909,057 | * | 6/1999 | McCormick et al. ................ 257/704 |
| 5,956,576 | * | 9/1999 | Toy et al. .............................. 438/125 |
| 6,002,171 | * | 12/1999 | Desai et al. ........................... 257/707 |
| 6,008,536 | * | 12/1999 | Mertol ................................... 257/704 |

* cited by examiner

*Primary Examiner*—Kevin M. Picardat
(74) *Attorney, Agent, or Firm*—Mathews, Collins, Shepherd & Gould, P.A.

(57) ABSTRACT

In accordance with the invention, a semiconductor die having an input/output contact surface is interconnected with a substrate. A metal plate having a surface cavity is provided for receiving the die. The plate has peripheral surface regions surrounding the cavity. The die is mounted in the cavity with its contact surface co-planar with the peripheral regions, and a sealable contact region forming closed figure around the die is provided on the peripheral surface regions of the plate. A substrate surface is provided with a corresponding contact regions for receiving the die and the plate. The plate/die structure is mounted and solder bonded on the substrate. The resulting structure has reduced thermal impedance from the die/board surface through the plate and a continuous peripheral hermetic seal around the die.

4 Claims, 2 Drawing Sheets

US 6,312,978 B1

METHOD FOR LEADLESS DIE INTERCONNECT WITHOUT SUBSTRATE CAVITY

CROSS-REFERENCE TO RELATED APPLICATIONS

This application claims the benefit of United States Provisional Patent application Ser. No. 60/175,078 filed on Jan. 7, 2000.

FIELD OF THE INVENTION

This invention relates to methods for connecting semiconductor devices onto substrates and, in particular, to a method which is particularly useful for connecting a semiconductor die onto a circuit board surface. The method provides hermetic sealing of the interconnect region and minimal electrical and thermal impedance. It does not require a surface cavity in the substrate.

BACKGROUND OF THE INVENTION

In the fabrication of practical electronic circuits, semiconductor dies containing electronic devices are connected to leads on a substrate such as a circuit board. Such connections need to be made with minimal electrical (resistive and inductive) impedance, minimal thermal impedance, and hermetic sealing of the interconnected region. Resistive and inductive impedance limits speed. Thermal impedance limits power, and moisture limits operating life.

Electronic devices used in practical electronic circuits are typically semiconductor dies in small outline packages. The devices are generally one of two types: "horizontal" devices where all of the input/output (I/O) contacts are on the top surface and "vertical" devices where some of the I/O contacts are on the top surface and some are on the bottom surface. Horizontal devices include typical integrated circuits (IC's) and some field effect transistors (FETs). For example, a FET may have the source and gate contacts on the top and the drain contact on the bottom.

An early approach to packaging was to place the semiconductor die on a lead frame and bond wires between the top contacts and the lead frame. The die/lead frame structure was then encapsulated in plastic or ceramic for hermetic sealing. This approach suffered large electrical (R,L) impedances from the bond wires and large thermal impedance to heat removal.

In an effort to reduce these impedances, the flip-chip mounting approach was developed. Solder "bumps" were placed on the top contacts of the die, the die was rotated so that the contact surface faced down onto the circuit board, and the contacts with their solder bumps were mounted with registration onto a corresponding pattern of contacts on the circuit board. A heat sink in the form of a metal plate was disposed on the top surface (the former bottom before flipping).

Flip-chip mounting reduced electrical and thermal impedance, but it presented a problem in hermetic sealing. The solder-bump/circuit board interface can be sealed by applying a peripheral epoxy seal around the edges of the die. But this is a difficult and meticulous process. Alternatively, a glob of epoxy can be applied on the new die top, encapsulating the entire device. But this does not work well for a vertical device where electrical contact must be made with the new top, and it aggravates thermal impedance.

A recent variation of the flip-chip approach involves providing a metal plate including a cavity, disposing the semiconductor die within the cavity in such a manner that its surface with I/O contacts is substantially coplanar with the plate, and applying solder bumps to both the I/O contacts and the peripheral metal surface. The metal/semiconductor structure is then flip-chip mounted onto the circuit board.

This variation also presents problems. With the larger area structure, flip-chip registration of the die contacts and the circuit board contacts is difficult. There remains substantial thermal impedance through the solder bumps at the die/board interface, and this variation leaves unresolved the problem of hermetic sealing.

SUMMARY OF THE INVENTION

In accordance with the invention, a semiconductor die having an input/output contact surface is interconnected with a substrate. A metal plate having a surface cavity is provided for receiving the die. The plate has peripheral surface regions surrounding the cavity. The die is mounted in the cavity with its contact surface co-planar with the peripheral regions, and a sealable contact region forming closed figure around the die is provided on the peripheral surface regions of the plate. A substrate surface is provided with a corresponding contact regions for receiving the die and the plate. The plate/die structure is mounted and solder bonded on the substrate. The resulting structure has reduced thermal impedance from the die/board surface through the plate and a continuous peripheral hermetic seal around the die.

BRIEF DESCRIPTION OF THE DRAWINGS

The advantages, nature and various additional features of the invention will appear more fully upon consideration of the illustrative embodiments now to be described in detail in connection with the accompanying drawings. In the drawings.

It is to be understood that these drawings are for illustrating the concepts of the invention and are not to scale.

DETAILED DESCRIPTION

Figure 1:
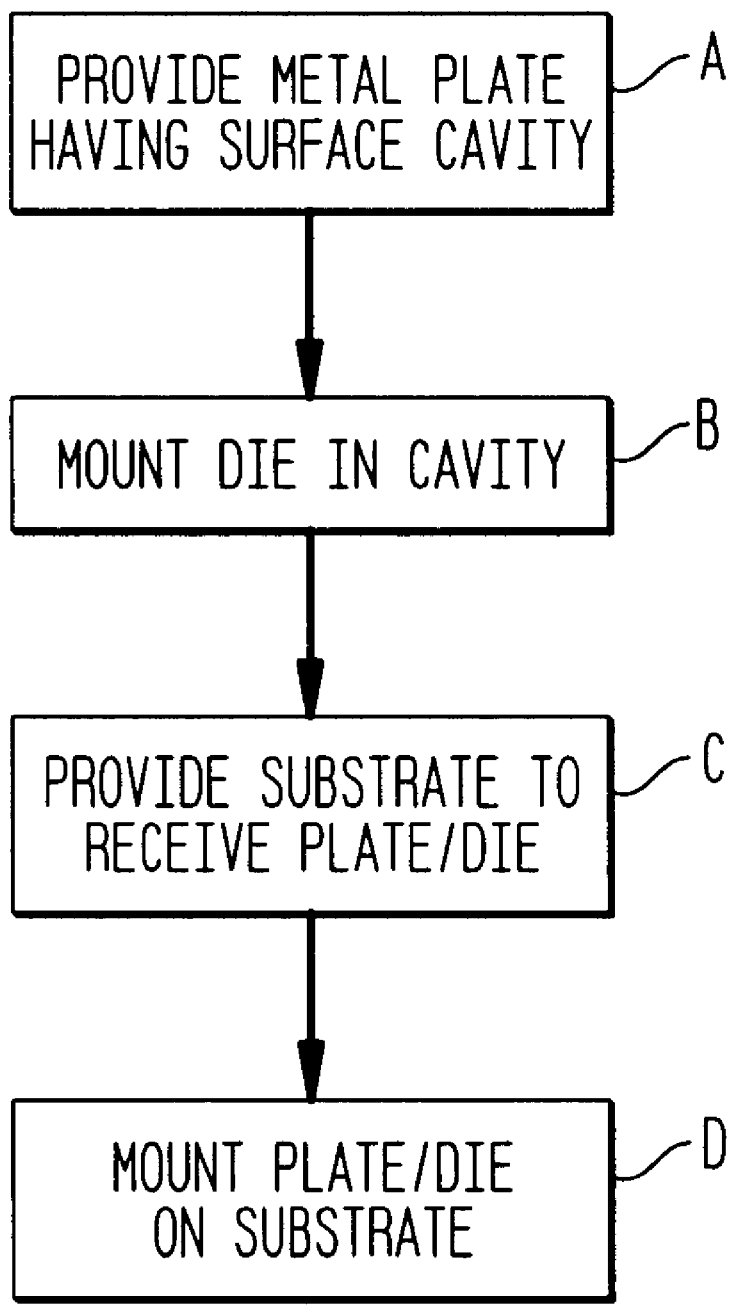
FIG. 1 is a flow diagram illustrating the steps in connecting a semiconductor die in accordance with the invention.

Referring to the drawings, FIG. 1 is a flow diagram illustrating the steps in connecting a semiconductor die onto a substrate. The first step, shown in Block A, is to provide a metal plate having a surface cavity for receiving the die and a sealable contact region surrounding the periphery of the cavity.

Figure 2:
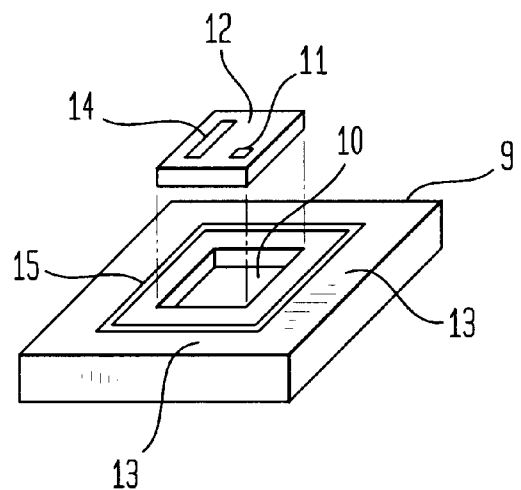
FIG. 2 is an exploded view of a semiconductor die mounted within a cavity in a metal plate.

FIG. 2 is a schematic drawing showing the metal plate 9 including the surface cavity 10 for enclosing the semiconductor die 11. The plate 9 has a planar peripheral surface region 13 surrounding the cavity 9, and a sealable contact region 15 surrounding the periphery of the cavity. The plate 9 is preferably a thermally conductive metal such as copper or aluminum. Surface cavity 10 can be made by molding, machining or pressing.

The next step, Block B of FIG. 1, is to mount the die in the cavity with the die contact surface co-planar with the peripheral surface 13 of the plate.

FIG. 2 shows the die 11 in position for insertion within the cavity 10. The die contact surface 12 includes solderable metal contacts 14. When the die is mounted in the cavity 10, its input/output surface 12 is substantially co-planar with the plate peripheral region 13, and the sealable contact region 15 forms a closed figure surrounding the die.

The third step shown in block C of FIG. 1 is to provide the substrate with a surface for receiving the plate/die structure. Specifically, the substrate surface is provided with a pattern of leads and solder areas 18 corresponding to the solderable metal contacts 14 of die. In addition, the substrate surface includes a sealable contact region 17 corresponding to the plate region 15.

The substrate can be any of the organic substrates conventionally used in the fabrication of printed circuits. Preferably it is a multilayer printed circuit board comprising multiple laminated insulating layers. The insulating layers can be glass cloth (woven or non-woven) impregnated with epoxy resin, polymide, cyanate ester or RT resin or layers of paper impregnated with phenolic resin. The conductive layers are typically copper foil. Alternatively the substrate can be a ceramic substrate such as can be formed from printed, stacked, pressed and sintered layers of green ceramic tape.

The contacts 14, 18 and the sealable contact regions 13, 17 are typically coated copper. They can be coated with various metallic or polymer finishes for corrosion resistance and to improve the wetting of molten solder. Typical coatings are Au, Sn, and imidazole. At least one of each pair of mating contacts should be coated with solder.

The next step (Block D of FIG. 1) is to mount and solder bond plate/die structure onto the substrate surface. The mounting involves "flipping" the plate/die structure so that the contact regions 14, 15 are aligned with and contact the respective contact regions 18, 17 on the substrate.

Figure 3:
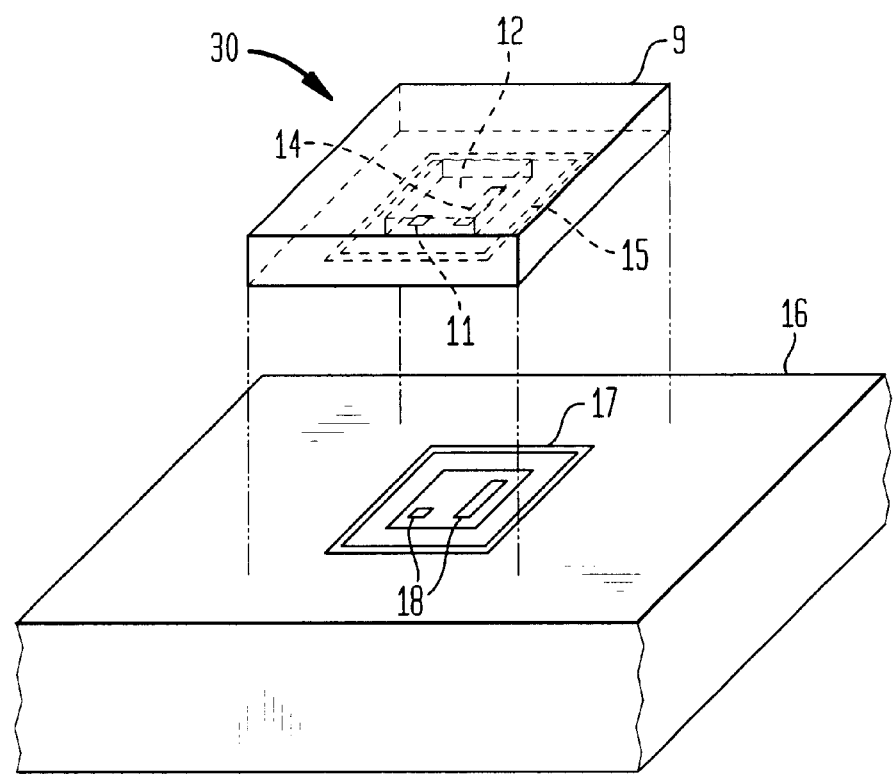
FIG. 3 is a exploded view of the metal plate/die combination mounted on a substrate.

FIG. 3 illustrates the plate/die structure 30 in position for mounting onto substrate 16. The substrate 16 provides a contact region 17 for receiving the closed path contact region 15 on the plate peripheral regions 13 and contact regions 18 for receiving and contacting the die contacts 14. The resulting structure has reduced thermal impedance from the die/substrate interface by virtue of the passage of heat through the peripheral plate regions and a continuous peripheral hermetic seal of the interconnect region.

It is to be understood that the above-described embodiments are illustrative of only a few of the many possible specific embodiments which can represent applications of the principles of the invention. Numerous and varied other arrangements can be readily devised by those skilled in the art without departing from the spirit and scope of the invention.

What is claimed is:

1. A method of interconnecting a semiconductor die having an input/output contact surface with a substrate comprising the steps of:

providing a metal plate having a surface with a cavity for receiving the die, the plate having a sealable contact region on the peripheral region surrounding the cavity;

forming a plate/die structure by mounting the die in the cavity with its contact surface co-planar with the peripheral region;

providing a substrate having a surface including corresponding contact regions for receiving and bonding the plate/die structure; and mounting the plate/die structure on the substrate.

2. The method of claim 1 wherein the metal plate comprises copper or aluminum.

3. The method of claim 1 wherein the substrate comprises a multilayer printed circuit board.

4. The method of claim 1 wherein the substrate comprises ceramic material.

\* \* \* \* \*